United States Patent
Ohto et al.

(10) Patent No.: US 6,879,042 B2
(45) Date of Patent: Apr. 12, 2005

(54) SEMICONDUCTOR DEVICE AND METHOD AND APPARATUS FOR MANUFACTURING THE SAME

(75) Inventors: Koichi Ohto, Tokyo (JP); Takayuki Matsui, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 270 days.

(21) Appl. No.: 09/883,370

(22) Filed: Jun. 19, 2001

(65) Prior Publication Data
US 2001/0054765 A1 Dec. 27, 2001

(30) Foreign Application Priority Data
Jun. 20, 2000 (JP) ......................................... 2000-185275

(51) Int. Cl.[7] .............................................. H01L 23/053
(52) U.S. Cl. ........................ 257/751; 257/764; 257/762; 257/774; 257/752; 257/753; 257/754; 257/761; 436/627; 436/643; 436/687
(58) Field of Search .................................. 257/751, 758, 257/762, 767, 760, 763, 773, 753; 438/622, 628, 629, 618, 637, 639, 687, 587, 689, 149, 694

(56) References Cited

U.S. PATENT DOCUMENTS

| | | | | |
|---|---|---|---|---|
| 5,793,112 A | * | 8/1998 | Hasegawa et al. ............ 257/758 |
| 5,939,788 A | * | 8/1999 | McTeer ......................... 257/751 |
| 6,100,195 A | * | 8/2000 | Chan et al. .................... 438/687 |
| 6,124,198 A | * | 9/2000 | Moslehi ........................ 438/622 |
| 6,140,238 A | * | 10/2000 | Kitch ............................ 438/687 |
| 6,184,143 B1 | * | 2/2001 | Ohashi et al. ................ 438/697 |
| 6,228,767 B1 | * | 5/2001 | Yakura ......................... 438/687 |
| 6,255,233 B1 | * | 7/2001 | Smith et al. .................. 438/786 |
| 6,291,891 B1 | * | 9/2001 | Higashi et al. ............... 257/774 |
| 6,335,570 B2 | * | 1/2002 | Mori et al. .................... 257/751 |
| 6,383,907 B1 | * | 5/2002 | Hasegawa et al. ............ 438/597 |
| 6,420,258 B1 | * | 7/2002 | Chen et al. ................... 438/622 |
| 6,468,906 B1 | * | 10/2002 | Chan et al. .................... 438/687 |
| 6,566,258 B1 | * | 5/2003 | Dixit et al. ................... 438/687 |
| 2001/0045652 A1 | * | 11/2001 | Mori et al. .................... 257/751 |

FOREIGN PATENT DOCUMENTS

| JP | 7-183300 | 7/1995 |
|---|---|---|
| JP | 7-201851 | 8/1995 |
| JP | 7-297186 | 11/1995 |
| JP | 2000-012544 | 1/2000 |

* cited by examiner

Primary Examiner—Nathan J. Flynn
Assistant Examiner—Fazli Erdem
(74) Attorney, Agent, or Firm—Young & Thompson

(57) ABSTRACT

In a semiconductor device, an interlevel insulating film formed between a Cu interconnection, formed by damascene, and an upper metal interconnection layer on it has a multilayered structure made up of a Cu diffusion preventive insulating layer and another insulating film. The Cu diffusion preventive insulating layer has a multilayered structure made up of not less than two layers. A method for manufacturing the semiconductor device is also disclosed.

8 Claims, 4 Drawing Sheets

SEMICONDUCTOR DEVICE AND METHOD AND APPARATUS FOR MANUFACTURING THE SAME

BACKGROUND OF THE INVENTION

1. Field of the Invention

The present invention relates to a semiconductor device and a method and apparatus for manufacturing the same and, more particularly, to a Cu diffusion preventive insulating layer in an interlevel insulating film formed between a Cu interconnection and a metal interconnection on it.

2. Description of the Prior Art

In the IC manufacturing field, as the operation speed and integration degree of devices increase, the device design rule decreases. As the device feature size decreases, the interconnection size and the gap between interconnections also decrease, so the interconnection resistance and the parasitic capacitance between interconnections tend to increase.

When the interconnection resistance or parasitic capacitance between interconnections increases, the RC time constant increases, and the signal propagation speed decrease to pose a problem in increasing the operation speed of the device. The parasitic capacitance between interconnections increases in proportion to the area of the interconnections and the relative dielectric constant of an insulating film between the interconnections, and in inverse proportion to the gap between the interconnections. To decrease the parasitic capacitance without changing the device design, it is effective to decrease the relative dielectric constant of the insulating film.

In recent years, various types of interlevel insulating films with low dielectric constants, e.g., an SiOF film with a lower relative dielectric constant than that of a conventional $SiO_2$ film, has been studied in order to decrease the capacitance between interconnections. To decrease the interconnection resistance, a technique which uses as an interconnection material Cu with a lower resistivity than that of Al conventionally used widely as the interconnection material, and products as a result of this technique have become popular.

When Cu is used as the interconnection material, since it is difficult to micropattern Cu by dry etching, a damascene interconnection structure as shown in FIG. 1 is usually used widely. A damascene interconnection is formed in the following manner. A trench is formed in an interlevel film 6, and is filled with a barrier metal 10 and Cu. Excessive Cu and barrier metal on the insulating film are removed by CMP, thus forming a Cu interconnection 12.

If an interlevel insulating film is to be formed after formation of the damascene interconnection, as Cu easily reacts with $SiO_2$ and diffuses, an SiN film 52 is usually formed as a diffusion preventive insulating film on Cu to a thickness of about 50 nm to 100 nm in accordance with parallel-plate plasma CVD by using $SiH_4$, $NH_3$, and $N_2$, and after that an insulating film 20 of $SiO_2$ or the like is formed.

In this case, SiN not only prevents Cu diffusion but also prevents the Cu surface from being exposed to the $SiO_2$ etching or $O_2$ resist ashing atmosphere when, e.g., a via hole is to be formed on the Cu damascene interconnection, so it also serves as an etching stop layer for $SiO_2$. In this manner, the SiN film 52 formed on the Cu surface must prevent Cu diffusion and serve as an etching-stop layer.

Problems to be solved by the present invention are as follows.

1. Usually, when a SiN film is to be formed on a Cu surface, as the film formation temperature is about 400 degrees of Celsius thermometer, as the substrate temperature increases, aggregation of Cu tends to occur, and the morphology of the Cu surface degrades. Hence, a diffusion preventive insulating layer in which aggregation of Cu is suppressed is necessary.

2. One of methods of suppressing aggregation of Cu is to decrease the film formation temperature. When the film formation temperature is decreased, SiN forms a low-density insulating film. If the insulating film has a low density, the etching selectivity with respect to $SiO_2$ decreases, and the SiN film cannot serve as an etching stop layer. For this reason, a dense film for maintaining the etching selectivity with respect to the insulating film is necessary as a diffusion preventive layer.

SUMMARY OF THE INVENTION

The present invention has been made to solve the above problems of the prior art, and has as its object to provide a semiconductor device with an interlevel insulating film which can suppress aggregation of Cu and has a sufficiently high etching selectivity with respect to an insulating film, and a method and apparatus for manufacturing the same.

In order to achieve the above object, according to the first main aspect of the present invention, there is provided a semiconductor device in which an interlevel insulating film formed between a Cu interconnection formed by damascene and an upper metal interconnection layer formed on said Cu interconnection has a multilayered structure made of a Cu diffusion preventive insulating layer and another insulating film, wherein said Cu diffusion preventive insulating layer has a multilayered structure made of not less than two layers.

The semiconductor device according to the first main aspect has the following subsidiary aspects.

The Cu diffusion preventive insulating layer is formed by CVD so as to be made up into a multilayered structure.

The Cu diffusion preventive insulating layer has a multilayered structure made up of a first Cu diffusion preventive insulating film formed by CVD at a temperature of less than 350° C. and a second Cu diffusion preventive insulating film formed by CVD at a high temperature of not less than 350° C. and not more than 450° C.

An oxide layer on a Cu surface, which is formed between said Cu diffusion preventive insulating layer and said Cu interconnection, is reduced in order to improve adhesion properties of said Cu diffusion preventive insulating layer.

The first Cu diffusion preventive insulating film is an insulating film not containing O, and the first Cu diffusion preventive insulating film not containing O is one film selected from the group consisting of an SiN film, SiC film, SiCN film, and organic film.

A dry etching selectivity of said second Cu diffusion preventive insulating film to said interlevel insulating film formed on said second Cu diffusion preventive insulating film is not less than 1:10.

In order to achieve the above object, according to the second main aspect of the present invention, there is provided a semiconductor device manufacturing method of forming an interlevel insulating film into a multilayered structure made of a Cu diffusion preventive layer and another insulating film between a Cu interconnection formed by damascene and an upper metal interconnection layer on said Cu interconnection, comprising forming at least two stacked Cu diffusion preventive insulating layers as said Cu diffusion preventive layer.

The semiconductor device manufacturing method according to the second main aspect has the following subsidiary aspects.

The Cu diffusion preventive layer is formed into at least two stacked layers by CVD.

The Cu diffusion preventive layer is formed by forming a first Cu diffusion preventive insulating film by CVD at a low temperature of less than 350° C., and forming a second Cu diffusion preventive insulating film by CVD at a high temperature of not less than 350° C. and not more than 450° C.

The Cu diffusion preventive layer forming step comprises reducing a Cu oxide layer formed on said Cu interconnection and forming said Cu diffusion preventive layer in order to improve adhesion properties of said Cu diffusion preventive insulating layer.

In this manner, when the first insulating film is formed on the Cu interconnection at a low temperature of less than 350° C. so aggregation of Cu is suppressed, and the second insulating film is formed at a high temperature of not less than 350° C. and not more than 450° C., a Cu diffusion preventive insulating layer with a multilayered structure, which functions highly as an etch stop layer, can be formed.

The first effect of the present invention is that it can suppress aggregation of Cu in the Cu interconnection. Aggregation of Cu is suppressed because the first insulating film is formed at a low temperature of less than 350° C.

The second effect of the present invention is that it can improve the etching selectivity of the insulating film to the Cu diffusion preventive insulating layer (e.g., $SiO_2$ and SiN). The reason is that, since a Cu diffusion preventive insulating layer has a multilayered structure made of not less than two layers, and further the second Cu diffusion preventive insulating film is formed at a high temperature of not less than 350° C. and not more than 450° C., such a Cu diffusion preventive insulating layer as being denser and having a better film quality than a Cu diffusion preventive insulating layer formed at a temperature of less than 350° C. can be formed.

DETAILED DESCRIPTION OF PREFERRED EMBODIMENTS

A semiconductor device and a method of manufacturing the same according to the first embodiment of the present invention will be described with reference to the accompanying drawings.

FIGS. 2A to 2K show a process of manufacturing a semiconductor device according to the present invention in the order of its steps.

Figure 1:
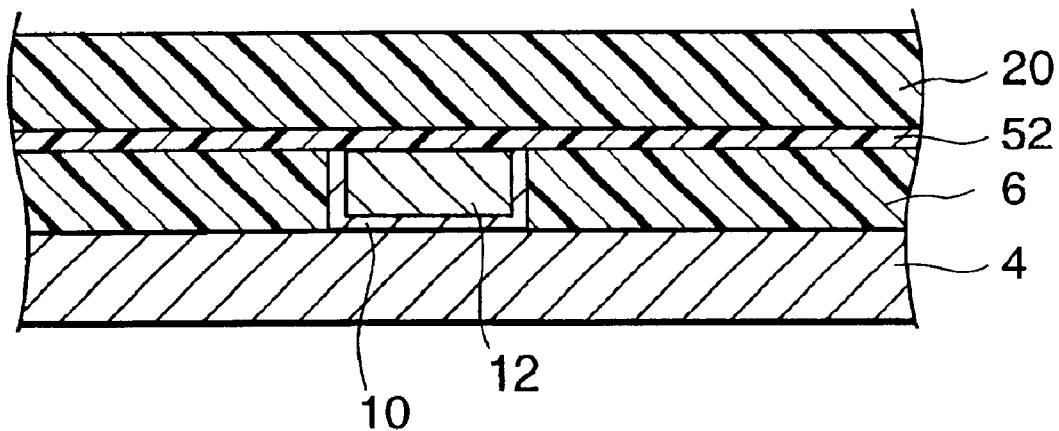
FIG. 1 is a sectional view for describing a prior art.
Figure 2A:
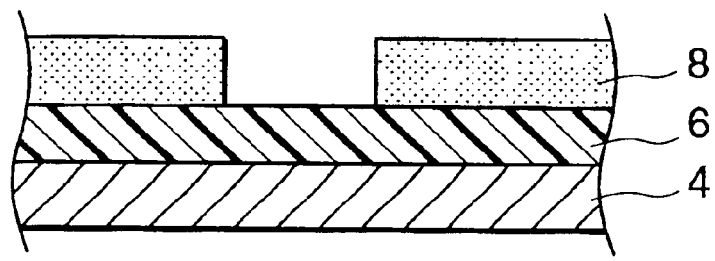
FIGS. 2A to 2K are sectional views showing a process of manufacturing a semiconductor device according to the present invention in the order of its steps.

First, as shown in FIG. 2A, an $SiO_2$ insulating film 6 is formed on a silicon substrate 4 with a device element to a thickness of 500 nm by plasma CVD. Subsequently, a photoresist 8 is applied to the $SiO_2$ insulating film 6, and a trench interconnection pattern is formed by photolithography.

Figure 2B:
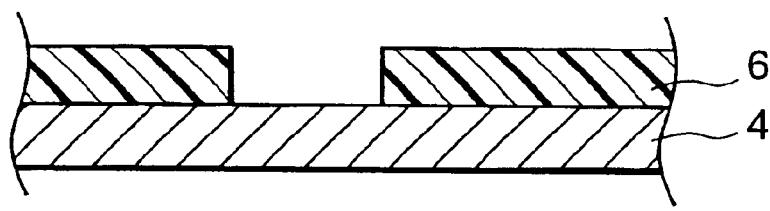
Figure 2C:
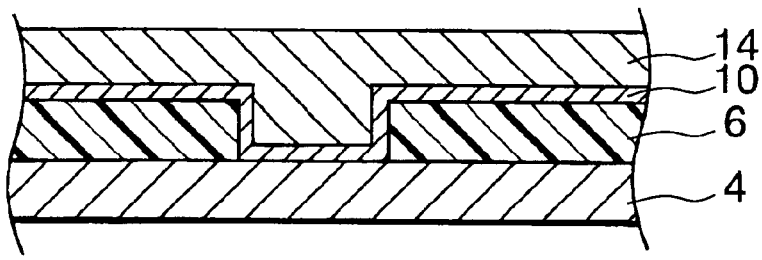

As shown in FIG. 2B, the insulating film 6 is etched by dry etching to form a trench, and the photoresist 8 is removed by $O_2$ dry ashing and wet etching. After that, Ta 10 is formed as a barrier metal to a thickness of 50 nm, and a Cu film is formed by sputtering to a thickness of 100 nm as a seed layer for Cu plating on the entire surface of the silicon substrate 4 (see FIG. 2C).

Figure 2D:
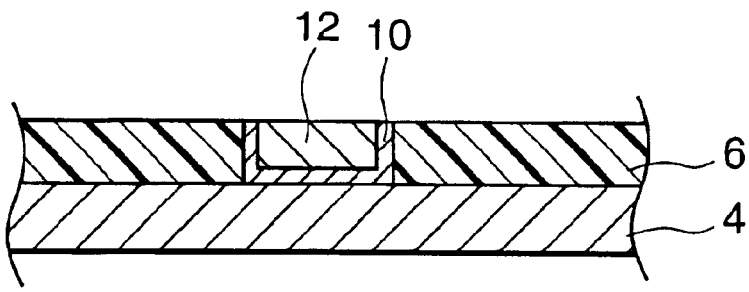

The trench is filled with Cu 14 by electrolytic plating, and Cu is annealed at 400° C. Then, as shown in FIG. 2D, the Cu 14 and barrier metal 10 on the insulating film 6 are removed by CMP, thus forming the Cu interconnection 12.

Figure 2E:
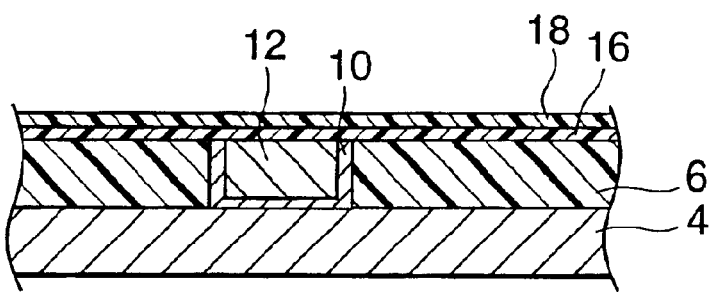

As shown in FIG. 2E, by using a single-wafer type parallel-plate CVD apparatus, a diffusion preventive insulating layer SiN as a first insulating film 16 is formed to a thickness of 20 nm by low-temperature film formation with a film formation temperature of 300° C, an $SiH_4$ flow rate of 50 sccm, an $NH_3$ flow rate of 30 sccm, an $N_2$ flow rate of 2,000 sccm, a film formation pressure of 4 Torr, and an RF power of 400 W. After that, by using another film formation chamber, a diffusion preventive insulating layer SiN as a second insulating film 18 is formed to a thickness of 30 nm by high-temperature film formation with a film formation temperature of 400° C., an $SiH_4$ flow rate of 50 sccm, an $NH_3$ flow rate of 30 sccm, an $N_2$ flow rate of 2,000 sccm, a film formation pressure of 4 Torr, and an RF power of 400 W.

Figure 2F:
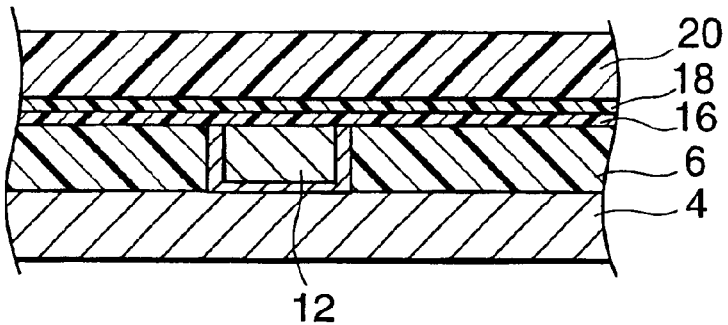

As shown in FIG. 2F, a 500-nm thick $SiO_2$ film is formed as an insulating film 20 by plasma CVD. The first and second insulating films 16 and 18 and the insulating film 20 make up the interlevel insulating film.

Figure 2G:
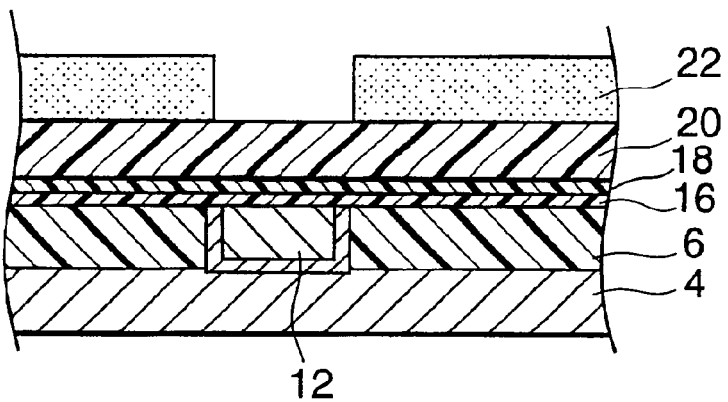
Figure 2H:
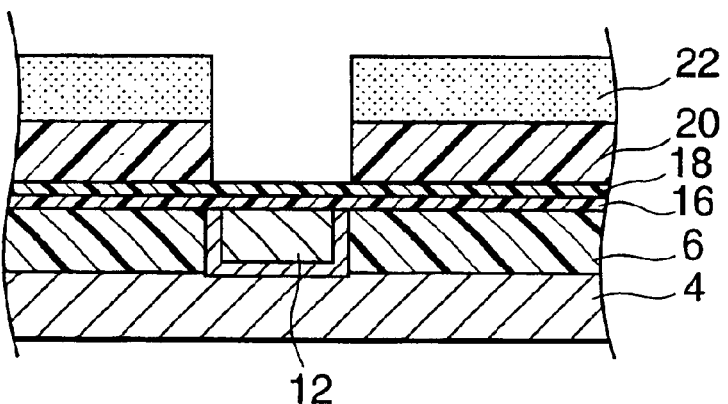

How to form a via hole in the interlevel insulating film comprised of the insulating film 20 and the like will be described. As shown in FIG. 2G, a pattern for forming a via hole is formed with a photoresist 22 by photolithography, and the $SiO_2$ film as the insulating film 20 is etched by dry etching using $C_4F_8$, Ar, and $O_2$ (see FIG. 2H). In this case, the etching conditions are determined such that the etching selectivity of the Cu diffusion preventive insulating film of the insulating film 20 to that of the second insulating film 18 is 10 or more, so the Cu diffusion preventive insulating film of the second insulating film 18 serves as the etching stop layer when etching the insulating film 20.

Figure 2I:
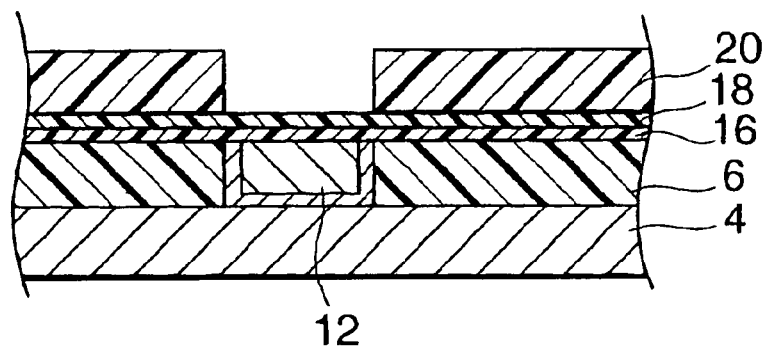

As shown in FIG. 2I, the photoresist 22 is removed by $O_2$ ashing and resist peeling technique using a wet etchant. At this time, oxidation and etching of the first and second insulating films 16 and 18, which occur when the surface of a Cu interconnection 12 is exposed to an $O_2$ plasma and the like, are prevented.

Figure 2J:
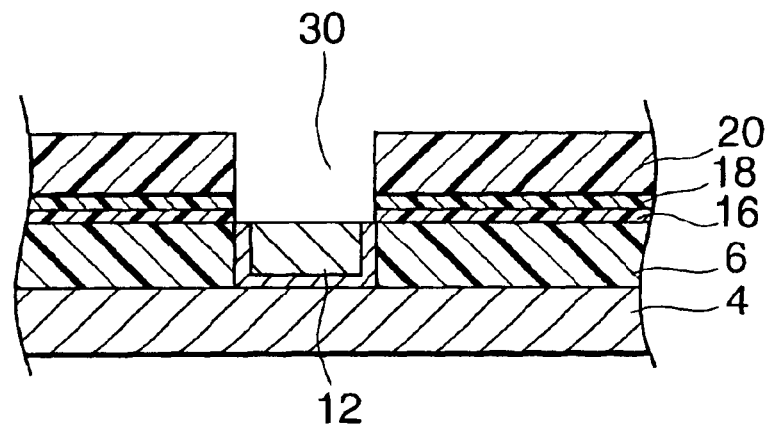

As shown in FIG. 2J, the Cu diffusion preventive insulating layer comprised of the first and second insulating layers 16 and 18 is etched by dry etching using $C_4F_8$ and Ar, to form a via hole 30.

Figure 2K:
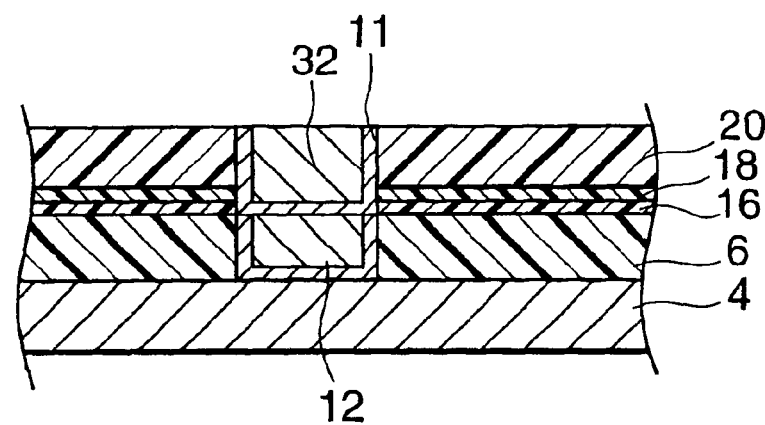

As shown in FIG. 2K, a TiN film 11 is formed to a thickness of 50 nm, and thereafter a W (tungsten) film 32 is formed to a thickness of 700 nm. The W film 32 fills the via hole 30, and the excessive W film 32 and TiN film 11 on the interlevel insulating film 20 are removed by CMP, thus forming a via contact with respect to the Cu interconnection 12.

In the above case, SiN is used to form the diffusion preventive insulating layer comprised of the first and second insulating films 16 and 18. Alternatively, an insulating film such as a SiC, SICN, or organic film which does not react with Cu and thus serves to prevent diffusion of Cu may be employed. To form the insulating film 20, $SiO_2$ is used. Alternatively, an insulating layer, e.g., a porous silica, organic, HSQ, or MSQ film, with a lower relative dielectric constant than that of $SiO_2$ may be used.

In the second embodiment of the present invention, a Cu interconnection 12 is formed in accordance with the same method as that of the first embodiment.

Subsequently, by using a parallel-plate CVD apparatus, a plasma pre-process is performed with a process temperature of 300° C., an N$_2$ flow rate of 500 sccm, an NH$_3$ flow rate of 500 sccm, a pressure of 4 Torr, and an RF power of 200 W in order to reduce the oxide layer on the Cu surface. After that, a diffusion preventive insulating layer SiN as a first insulating film 16 is formed to a thickness of 20 nm with the same conditions as those of the first embodiment.

Subsequently, by using another CVD apparatus, a diffusion preventive insulating layer SiC as a second insulating film 18 is formed to a thickness of 30 nm with a film formation temperature of 400° C.

An SiO$_2$ layer is formed to a thickness of 500 nm by the parallel-plate plasma CVD apparatus, and an insulating film 20 is formed on the Cu interconnection 12.

In this case, the pre-process for reducing the Cu oxide layer is performed at 300° C. It suffices as far as aggregation of Cu is suppressed at less than 300° C. Although a plasma pre-process is performed, annealing in a reducing gas atmosphere of NH$_3$ or H$_2$ may be performed instead. Although N$_2$ and NH$_3$ are used as gases for the pre-process, a single-gas atmosphere of H$_2$ or NH$_3$, or a gas mixture atmosphere of N$_2$, H$_2$ and NH$_3$ may be used instead. The gas type is not particularly specified as far as it can reduce the oxide layer on the Cu surface. A process chamber for performing the plasma pre-process may be provided independently of the SiN film formation chamber.

In the above embodiments, SiN is used to form the Cu diffusion preventive insulating layer of the first insulating film 16, and SiC is used to form the Cu diffusion preventive insulating layer of the second insulating film 18. Alternatively, an SiCN, organic, or SiON film may be used as each insulating film. The diffusion preventive layers formed of the first and second insulating films 16 and 18 need not have the same film composition, and are not particularly specified as far as they have an etching selectivity of a predetermined value or more with respect to the insulating film 20. In the above embodiments, a Cu diffusion preventive insulating layer with a double-layer structure is formed. Alternatively, a multilayered structure of three or more layers-may be employed. The present invention is not particularly specified in this respect as well.

As the manufacturing apparatus, the CVD apparatus is used to form the first insulating film 16 at a temperature of about 300° C. and the second insulating film 18 at a temperature of about 400° C. Except for that, the arrangement of the manufacturing apparatus can be the same as that of a conventional apparatus.

What is claimed is:

1. A semiconductor interconnect structure comprising:
   a substrate;
   a first insulating film directly on said substrate;
   a first interconnect through said first insulating film and directly contacting said substrate, said first interconnect comprising a trench having a metal barrier layer on walls and a bottom of said trench and a copper layer within said trench;
   a first diffusion barrier film directly on said first insulating film, said first diffusion barrier film suppressing aggregation of copper and preventing diffusion of copper;
   a second diffusion barrier film directly on said first diffusion barrier film, said second diffusion barrier film being an etch stop layer;
   a second insulating film directly on said second diffusion barrier film; and
   a second interconnect through said first and second diffusion barrier films and said second insulating film, said second interconnect comprising a trench having a metal barrier layer on walls and a bottom of said trench and a copper layer within said trench.

2. The interconnect structure as claimed in claim 1, wherein said first and second interconnects are axially aligned.

3. The interconnect structure as claimed in claim 1, wherein said first diffusion barrier film and said bottom of said second interconnect are coplanar.

4. The interconnect structure as claimed in claim 1, wherein said bottom of said second interconnect contacts said walls of said first interconnect.

5. The interconnect structure as claimed in claim 1, wherein said first and second diffusion barrier films are different.

6. The interconnect structure as claimed in claim 1, wherein said first and second diffusion barrier films are the same and have different thicknesses.

7. The interconnect structure as claimed in claim 1, wherein the metal barrier layer on the walls of the first interconnect and the metal barrier layer on the walls of the second interconnect are aligned.

8. The interconnect structure as claimed in claim 1, wherein a bottom of said metal barrier layer of said first interconnect directly contacts an end of said walls of said metal barrier layer of said second interconnect.

* * * * *